United States Patent
Yabe

(10) Patent No.: US 8,581,156 B2
(45) Date of Patent: Nov. 12, 2013

(54) APPARATUS WITH HEATING PART

(75) Inventor: Mamoru Yabe, Sakado (JP)

(73) Assignee: Omron Corporation, Kyoto-shi, Kyoto (JP)

( * ) Notice: Subject to any disclaimer, the term of this patent is extended or adjusted under 35 U.S.C. 154(b) by 710 days.

(21) Appl. No.: 12/674,769

(22) PCT Filed: Aug. 28, 2008

(86) PCT No.: PCT/JP2008/065384
§ 371 (c)(1),
(2), (4) Date: May 7, 2010

(87) PCT Pub. No.: WO2009/034846
PCT Pub. Date: Mar. 19, 2009

(65) Prior Publication Data
US 2011/0114630 A1 May 19, 2011

(30) Foreign Application Priority Data
Sep. 13, 2007 (JP) .................. 2007-237885

(51) Int. Cl.
*H05B 3/02* (2006.01)

(52) U.S. Cl.
USPC .............. 219/538; 219/217; 219/544

(58) Field of Classification Search
USPC ......................... 219/538, 217, 544
See application file for complete search history.

(56) References Cited

U.S. PATENT DOCUMENTS
2004/0118579 A1 6/2004 McCutcheon et al.

FOREIGN PATENT DOCUMENTS

| JP | 2-78255 | 3/1990 |
|---|---|---|
| JP | 11-224924 A | 8/1999 |
| JP | 2004-241282 A | 8/2004 |
| JP | 2006-513390 | 4/2006 |
| JP | 2006-286639 A | 10/2006 |
| JP | 2007-005390 A | 1/2007 |

OTHER PUBLICATIONS

Patent Abstracts of Japan, Publication No. 02-078255, dated Mar. 19, 1990, 1 page.
International Search Report issued in PCT/JP2008/065384, mailed on Nov. 25, 2008, with translation, 8 pages.

*Primary Examiner* — Samuel Gebremariam
(74) *Attorney, Agent, or Firm* — Osha Liang LLP

(57) ABSTRACT

An apparatus has a chassis has a chassis inner face and a chassis outer face, at least one heating part accommodated in the chassis, wherein at least a portion of the heating part faces the chassis inner face with an internal space therebetween, and a film having a first face and a second face bonded to at least a portion of the heating part facing the chassis inner face. The chassis outer face is located on a side opposite the chassis inner face portion and in contact with an external space and having a radiation film interposed therebetween. The film includes a convex part, a concave part, or a repeated pattern of convex and concave parts in the first face or the second face. At least one of the first face and the second face is in contact with the internal space.

3 Claims, 4 Drawing Sheets

(a)

(b)

(a)

(b)

APPARATUS WITH HEATING PART

TECHNICAL FIELD

The present invention relates to an apparatus with a heating part.

BACKGROUND ART

Usually an electric instrument generates heat because the electric instrument includes a resistive element heating component therein. Except that the heat generation has no influence on an operating characteristic of the electric instrument, a radiator is added to the electric instrument when the operating characteristic of the electric instrument changes largely by the heat generation. For example, Patent Document 1 proposes a flexible heat absorber including a polymer base that contains thermal conductive particles and a polymer projection portion that is formed by plural thin and long projections projected from the base.

Patent Document 1: Japanese Unexamined Patent Publication No. 2006-513390

SUMMARY OF INVENTION

However, in the flexible heat absorber, because the thin and long, rectangular projection portion integral with the base is considerably projected from the base, unfortunately it is difficult to mold the projection portion.

One or more embodiments of the present invention provides an apparatus in which the heat of the apparatus such as the electric instrument can efficiently be released to the peripheral atmosphere with a simple structure.

In accordance with one aspect of the present invention, there is provided an apparatus with a heating part wherein a film is bonded to an outer face of the apparatus with an adhesive material interposed therebetween, the film having a flat first face and a second face, the second face having a convex part, a concave part, or a repeated pattern of the convex part and the concave part, the first face being orientated toward the outer face of the apparatus.

In accordance with another aspect of the present invention, there is provided an apparatus including a chassis and at least one heating part accommodated in the chassis, wherein at least part of the heating part faces the chassis inner face with an internal space therebetween, a film having a first face and a second face is bonded to at least the part of the heating part facing the chassis inner face, a chassis inner face portion facing at least the part, and an chassis outer face portion that is located on a side opposite the chassis inner face portion to come into contact with an external space while an adhesive material is interposed therebetween, and the film includes a convex part, a concave part, or a repeated pattern of the convex part and the concave part in the first face or the second face, the first face and the second face being in contact with the spaces.

According to one or more embodiments of the present invention, an apparatus including the film is a prism sheet that collects light emitted from a light source into a direction perpendicular to a display screen in a liquid crystal display device.

According to one or more embodiments of the present invention, the film and the adhesive material satisfy a relationship of Formula 1:

$$1/(h \cdot Ab) > dg/(\lambda g \cdot Ab) + dp/(\lambda p \cdot Ab) + 1/(h \cdot Ap)$$ [Formula 1]

where h: heat transfer coefficient [W/(m²·K)],

Ab: radiation face area [m²],
Ap: contact area of film with peripheral atmosphere [m²],
dg: adhesive material thickness [m],
λg: adhesive material thermal conductivity [W/(m·K)],
dp: film thickness [m], and
λp: film thermal conductivity [W/(m·K)]

According to one or more embodiments of the present invention, the heat generated in the apparatus can efficiently be released to the outside with the simple structure in which only the thin film is bonded to the apparatus.

| DESCRIPTION OF SYMBOLS | |
|---|---|
| 10: | electric instrument |
| 12: | package |
| 14: | printed circuit board |
| 16: | upper face |
| 18: | radiation film |
| 20: | adhesive material |
| 22: | bottom face (first face) |
| 24: | upper face (second face) |
| 26: | convex strip |
| 28: | concave strip |
| 30: | radiation model |
| 32: | radiation model |
| 34: | peripheral atmosphere |

DETAILED DESCRIPTION

Exemplary embodiments of the invention will be described below with reference to the accompanying drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

(Configuration of Electric Instrument)

Figure 1:
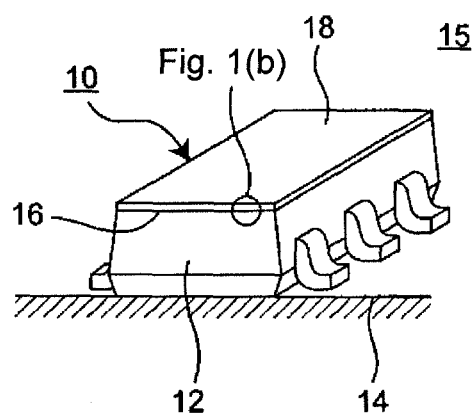
FIG. 1(a) is a perspective view of an electric instrument according to a first embodiment of the invention.
FIG. 1(b) is a partially enlarged view of the electric instrument.
Figure 1:
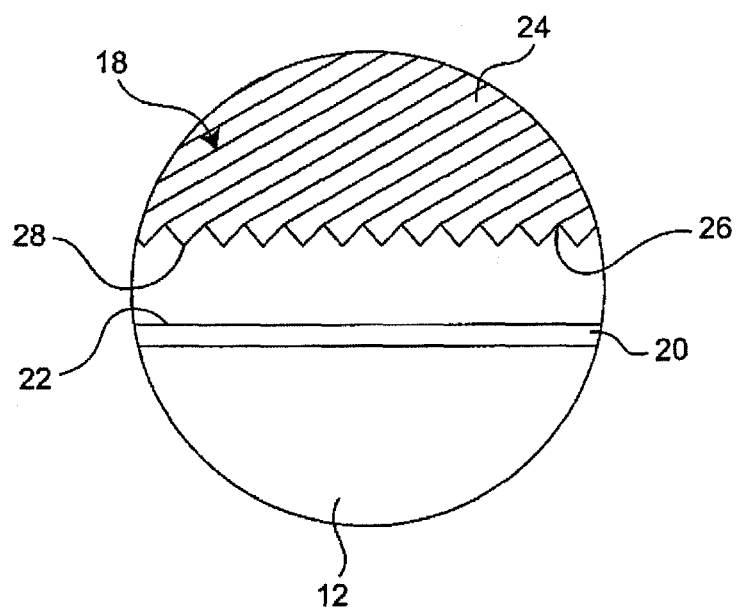

FIG. 1 illustrates an electric instrument 10 that is an apparatus according to a first embodiment of the invention. In the following embodiments, although the electric instrument 10 is expressed as SOP (Small Outline Package) that is of a semiconductor device, one or more embodiments of the invention can also be applied to other electric instruments. As illustrated in FIG. 1, the electric instrument 10 includes a package 12, and the electric instrument 10 is mounted on a printed circuit board 14. Heating elements (not illustrated) such as a semiconductor element are incorporated in the package 12, and the package 12 includes radiation means in an upper face 16 thereof in order to release the heat generated by the heating elements.

(Radiation Film)

The radiation means includes a thin radiation film 18. As illustrated in FIG. 1(b) in which part of the radiation film 18 is enlarged, the radiation film 18 is bonded to the upper face (radiation face) 16 of the electric instrument 10 by an adhesive material 20. The radiation film 18 has a thickness of 20 to 300 preferably the thickness of 50 to 150 μm. The radiation film 18 includes a bottom face (first face) 22 that faces the electric instrument 10 and an upper face (second face) 24 that is located on the side opposite to the electric instrument 10. A repeated pattern is formed in the upper face 24. In the repeated pattern, a triangular convex strip 26 and a triangular concave strip 28 are alternately formed at predetermined intervals.

(Radiation Model)

Figure 2:
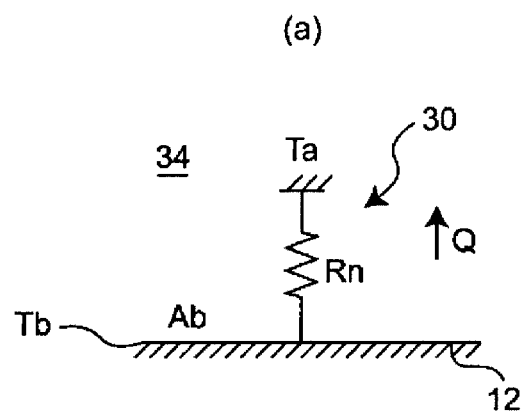
FIG. 2 is a view illustrating radiation models of Comparative Example 1 and the first embodiment.
Figure 2:
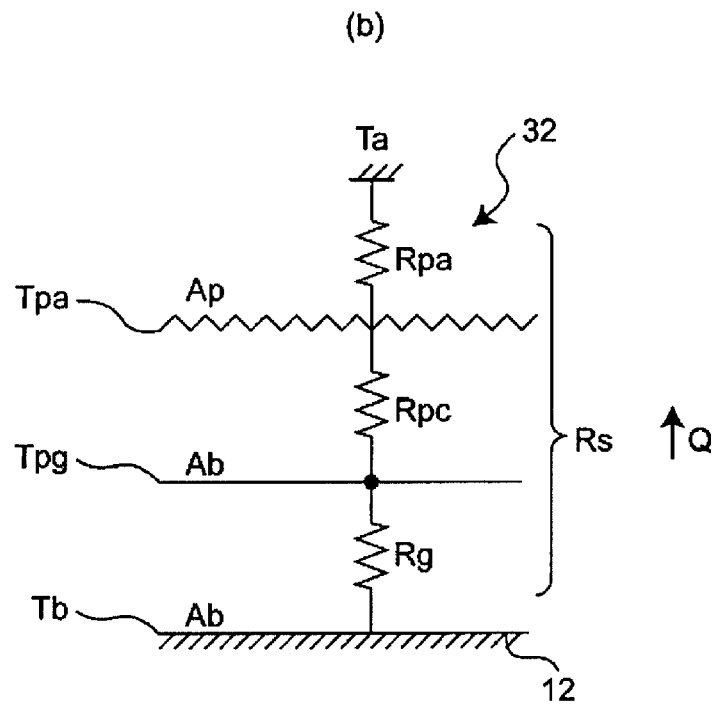

FIG. 2(a) illustrates a radiation model 30 of an electric instrument (radiation film is removed from electric instrument of FIG. 1) (Comparative Example 1) having no radiation film, and FIG. 2(b) illustrates a radiation model 32 of the electric instrument (electric instrument of FIG. 1) (first embodiment) having the radiation film.

COMPARATIVE EXAMPLE 1

In the radiation model of Comparative Example 1, the symbols have the following meanings:

TABLE 1

Description of symbols in radiation model of Comparative Example 1 (FIG. 2(a))

| Symbol | Description of symbol |
|---|---|
| Q: | Heat quantity released from radiation face of electric instrument [W] |
| Ta: | Peripheral atmosphere temperature [K] |
| Tb: | Upper face temperature of electric instrument [K] |
| Ab: | Radiation face area [m²] |
| Rn: | Thermal resistance [K/W] |

In the radiation model of Comparative Example 1, the heat quantity Q and the thermal resistance Rn are expressed by the following formulas 2 and 3. In the formulas, "h" is a heat transfer coefficient (W/(m²·K)), and the heat transfer coefficient h is a value that varies according to an environmental condition (for example, convectional condition).

[Formula 2]

$$Q = h \cdot Ab(Tb - Ta)[W] \quad (2)$$

[Formula 3]

$$Rn = (Tb - Ta)/Q = 1/(h \cdot Ab)[K/W] \quad (3)$$

First Embodiment

In the radiation model of the first embodiment, the symbols have the following meanings:

TABLE 2

Description of symbols in radiation model of the first embodiment (FIG. 2(b))

| Symbol | Description of symbol |
|---|---|
| Q: | Heat quantity released from radiation face of electric instrument [W] |
| Ta: | Peripheral atmosphere temperature [K] |
| Tb: | Upper face temperature of electric instrument [K] |

TABLE 2-continued

Description of symbols in radiation model of the first embodiment (FIG. 2(b))

| Symbol | Description of symbol |
|---|---|
| Tpa: | Interfacial temperature between concave-convex face of radiation film and peripheral atmosphere [K] |
| Tpg: | Interfacial temperature between adhesive material and radiation film [K] |
| Ab: | Radiation face area [m²] |
| Rpa: | Thermal resistance from concave-convex face of radiation film to peripheral atmosphere [K/W] |
| Rpc: | Thermal resistance in thickness direction of radiation film [K/W] |
| Rg: | Thermal resistance in thickness direction of adhesive material [K/W] |

In the radiation model of the first embodiment, the heat quantity Q released through the adhesive material and the thermal resistance Rg of the adhesive material are given by the following formulas 4 and 5. In the following formulas, "λg" is a thermal conductivity [W/(m·K)] of the adhesive material and "dg" is an adhesive material thickness [m].

[Formula 4]

$$Q = (\lambda g \cdot Ab/dg) \cdot (Tb - Tpg)[W] \quad (4)$$

[Formula 5]

$$Rg = (Tb - Tpg)/Q = dg/(\lambda g \cdot Ab)[K/W] \quad (5)$$

The heat quantity Q released through the radiation film and the thermal resistance Rpc of the radiation film are given by the following formulas 6 and 7. In the following formula, "λp" is a thermal conductivity [W/(m·K)] of the radiation film, and "dp" is a radiation film thickness [m].

[Formula 6]

$$Q = (\lambda p \cdot Ab/dp) \cdot (Tpg - TPa)[W] \quad (6)$$

[Formula 7]

$$Rpc = (Tpg - Tpa)/Q = dp/(\lambda p \cdot Ab)[K/W] \quad (7)$$

The heat quantity Q released from the concave-convex face of the radiation film through a peripheral atmosphere 36 (not illustrated) and the thermal resistance Rpa from the concave-convex face of the radiation film to the peripheral atmosphere are given by the following Formulas 8 and 9. In the following Formulas, "h" is the heat transfer coefficient (W/(m²·K)).

[Formula 8]

$$Q = (h \cdot Ap) \cdot (Tpa - Ta)[W] \quad (8)$$

[Formula 9]

$$Rpa = (Tpa - Ta)/Q = 1/(h \cdot Ap)[K/W] \quad (9)$$

In the radiation model of the first embodiment, a total thermal resistance Rs [K/W] is given by the following Formula 10.

[Formula 10]

$$Rs = Rg + Rpc + Rpa[K/W] = dg/(\lambda g \cdot Ab) + dp/(\lambda p \cdot Ab) + 1/(h \cdot Ap)[K/W] \quad (10)$$

The thermal resistances are computed for the radiation models of Comparative Example 1 and the first embodiment using the formulas 3 and 10. Numerical values are as follows. It is assumed that the radiation film is the film in which the triangular convex strip having a vertex angle of 90 degrees and the triangular concave strip are alternately formed as illustrated in FIG. 1.

TABLE 3

Numerical values

| Name | Unit | Remarks |
|---|---|---|
| Thermal conductivity of adhesive material ($\lambda$g) | 0.1 [W/(m · k)] | Material: polyester |
| Adhesive material thickness (dg) | 10 × 10$^{-6}$ [m] | |
| Thermal conductivity of radiation film ($\lambda$p) | 0.1 [W/(m · k)] | Material: polyester |
| Radiation film thickness (dp) | 56 × 10$^{-6}$ [m] | Average value |
| Heat transfer coefficient (h) | 6 [W/(m$^2$ · k)] | On the assumption of flat plate in natural convection |
| Radiation area of radiation film (Ap) | $\sqrt{2}$ · Ab | Prism array of convex strip and concave strip having vertex angle of 90 degrees |

TABLE 4 illustrates computation result.

TABLE 4

Computed value of thermal resistance

| Thermal resistance | Remarks |
|---|---|
| Rn = 0.17 × (1/Ab) [K/W] Rs = 0.12 × (1/Ab) [K/W] | Rg = 100 × 10$^{-6}$ (1/Ab) [K/W] Rpc = 560 × 10$^{-6}$ (1/Ab) [K/W] Rpa = 118 × 10$^{-3}$ (1/Ab) [K/W] |

As is clear from the computation result, for the electric instrument in which the radiation film (and adhesive material) is provided, the thermal resistance can be reduced about 0.7 time that of the electric instrument having no radiation film by the increase in radiation area.

As described above, in the electric instrument in which the radiation film is provided, radiation efficiency is improved by satisfying the following condition (Formula 11), compared with the electric instrument having no radiation film.

[Formula 11]

$$1/(h \cdot Ab) > dg/(\lambda g \cdot Ab) + dp/(\lambda p \cdot Ab) + 1/(h \cdot Ap) \quad (11)$$

h: heat transfer coefficient [W/(m$^2$·K)]
Ab: radiation area [m$^2$]
Ap: contact area of radiation film with peripheral atmosphere [m$^2$]
dg: adhesive material thickness [m]
$\lambda$g: adhesive material thermal conductivity [W/(m·K)]
dp: radiation film thickness [m]
$\lambda$p: radiation film thermal conductivity [W/(m·K)]

(Specific Example of Radiation Film)

Preferably a material having excellent thermal conductivity is used for the radiation film, and the radiation film may be made of synthetic resin or metal. The radiation film may be a composite sheet in which a plastic sheet and a metallic sheet are bonded to each other or a film in which outsert molding of a sheet is performed to a base material sheet. A plastic film-metallic plate composite material of "ALSET" (product name, available from Mitsubishi Plastics, Inc.) can suitably be used as the composite sheet.

Figure 3:
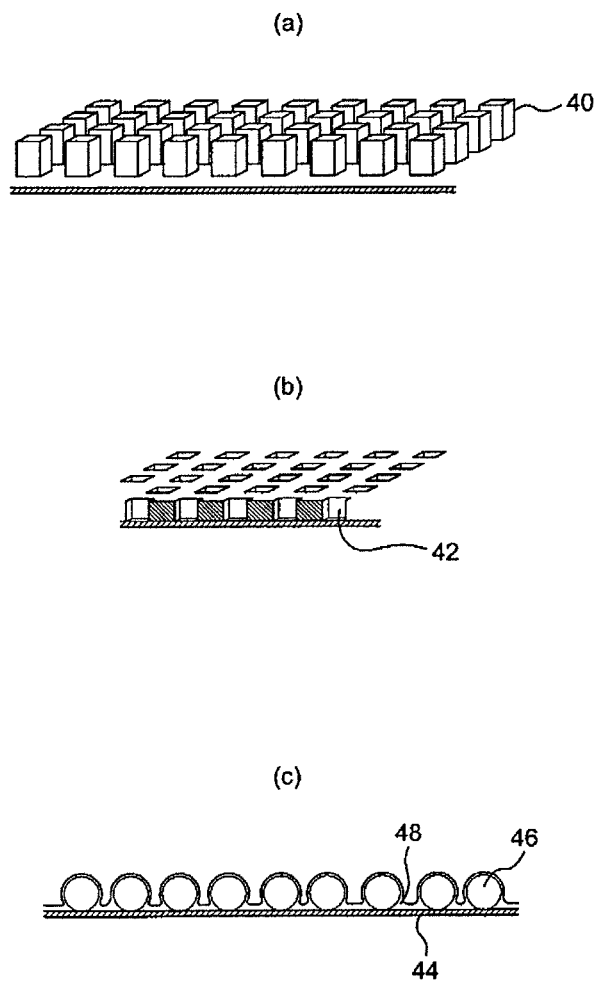
FIGS. 3(a) and 3(b) are perspective views illustrating another mode of a concave-convex pattern.
FIG. 3(c) is a sectional view of the concave-convex pattern.

A shape of the convex part, the concave part, or the repeated pattern of the convex part and the concave part, which are formed in the radiation film, is not limited to the shape in which the triangular convex strip and concave strip are alternately disposed, but the shape may be a curved surface or a combination of the triangle and the curved surface. It is not always necessary to continuously form the convex part and the concave part, but the convex part and the concave part may discontinuously be formed. In such cases, the convex part and the concave part may be formed into rectangular solid shapes 40 and 42 (see FIGS. 3(a) and 3(b)), a cylindrical shape, a pyramid shape, a needle shape, or a reverse U-shape in section. As illustrated in FIG. 3(c), in the radiation film, micro spherical beads 46 may be disposed in a surface of a sheet base material 44 while the beads 46 are fixed to the base material 44 by a binder 48.

Particularly preferably a prism sheet is used as the radiation film. In a backlight device of a liquid crystal device, the prism sheet collects the light emitted from a light source in a direction perpendicular to a display screen. For example, "Brightness Enhancement Film" such as Thin BEF series, BEF II series, DEF III series, RBEF series, and Wave Film series (product name, available from Sumitomo 3M Limited) is suitably used as the prism sheet. In the BEF II series, DEF III series, RBEF series, and Wave Film series, a prism pattern (triangular convex strip and triangular concave strip are alternately formed) are precisely molded on a polyester film layer having a thickness of 125 μm using acrylic resin, the triangular convex strip and concave strip have the vertex angles of 90 degrees, a prism pitch between the convex strip and the concave strip is 50 μm, and a thickness (distance from bottom face of polyester layer to convex top portion of acrylic resin layer) is 155 μm. Although the prism sheet of Thin BEF series has a similar configuration, the prism sheet of Thin BEF series has a thickness of 62 μm and a prism pitch of 24 μm. Both a convex strip crest portion and a concave strip valley portion are sharp in the BEF II series, and DEF III series, the convex strip crest portion has a curved surface in the RBER series, and both the convex strip crest portion and the concave strip valley portion have the curved surfaces in the Wave Film series.

The liquid crystal backlight prism sheet of "DIAART" (product name, available from MITSUBISHI RAYON CO., LTD) and the liquid crystal backlight component of "MIRABRIGHT" (product name, available from KURARAY CO., LTD) can also be used.

(Adhesive Material)

The adhesive material 20 is formed as thin as possible in order to suppress the thermal resistance to a lower level. For example, "Extremely thin double-coated adhesive tape No. 5601" available from NITTO DENKO CORPORATION can suitably used as the adhesive material. In the Extremely thin double-coated adhesive tape No. 5601, an acrylic adhesive agent, a polyester film base material, and an acrylic adhesive agent are laminated on a polyester film base material. The Extremely thin double-coated adhesive tape No. 5601 has a thickness of 0.01 mm. The adhesive material is not limited to the double-coated adhesive tape. For example, silicone grease may be used as the adhesive material.

(Other Materials)

A heat transfer sheet having high thermal conductivity may be interposed in a planar direction (direction orthogonal to thickness direction) between the radiation face of the electric instrument and the radiation sheet. At this point, even if the electric instrument unevenly generates the heat, the locally high heat of the electric instrument is dispersed by the heat transfer sheet to efficiently radiate the heat.

Second Embodiment

Figure 4:
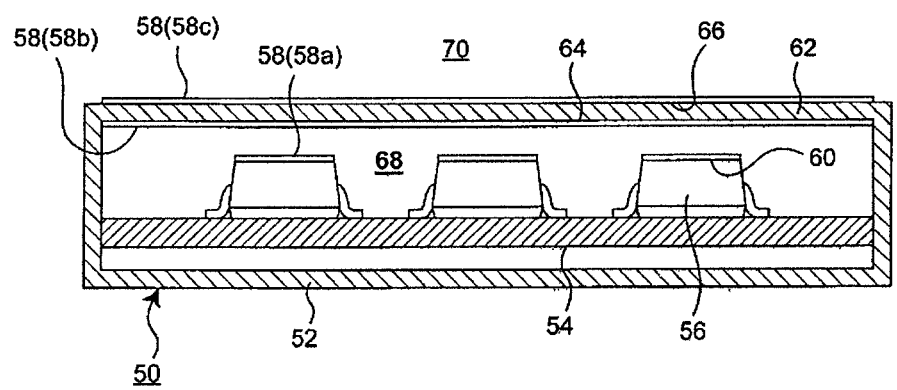
FIG. 4 is a sectional view of a semiconductor unit according to a second embodiment of the invention.

FIG. 4 illustrates an electric instrument or a semiconductor unit 50 according to a second embodiment of the invention.

The semiconductor unit 50 of the second embodiment of FIG. 4 includes a chassis 52. The chassis 52 can be made of metal, synthetic resin, or a composite material thereof. An electric circuit board 54 is provided in the chassis 52, and one or plural semiconductor components (heating part) 56 are connected on the board 54.

In the second embodiment, radiation films 58 are bonded to not only an outer face 60 of the semiconductor component 56 but also an inner face 64 and an outer face 66 of a chassis wall 62 that faces the semiconductor component 56 via an adhesive material (not shown) and a radiation film 58a provided in the semiconductor component 56 and a radiation film 58b provided in the chassis wall 62 face each other with a space 68 in the chassis interposed therebetween. A radiation film 58c faces the radiation film 58b with the chassis wall 62 interposed therebetween.

In the semiconductor unit 50, the heat generated in the semiconductor component 56 is released to the space 68 in the chassis through the radiation film 58a. The heat released to the space 68 is released to a peripheral atmosphere 70 through the inside radiation film 58b of the chassis wall 62, the chassis wall 62, and the outside radiation film 58c. At the same time, the radiation film 58a absorbing the heat from the semiconductor component 56 releases an electromagnetic wave, and the inside radiation film 58b of the chassis wall 62 absorbs the electromagnetic wave, thereby transferring the heat from the radiation film 58a to the radiation film 58b. The heat absorbed in the inside radiation film 58b is released to the peripheral atmosphere (external space) 70 through the chassis wall 62 and the outside radiation film 58c.

Thus, in the semiconductor unit 50 of the second embodiment, the heat of the heating component is efficiently released to the peripheral atmosphere through the two pathways of heat conduction and heat radiation. Particularly, in the second embodiment, the radiation films 58 are provided in not only the chassis outer face 66 but also the inside of the semiconductor unit 50, that is, the inner face 64 of the chassis wall 62 and the outer face 60 of the semiconductor component 56 accommodated in the chassis 52. Therefore, the heat is smoothly transferred in the chassis, and the heat generated in the heating component can efficiently be released to the peripheral atmosphere.

Third Embodiment

Figure 5:
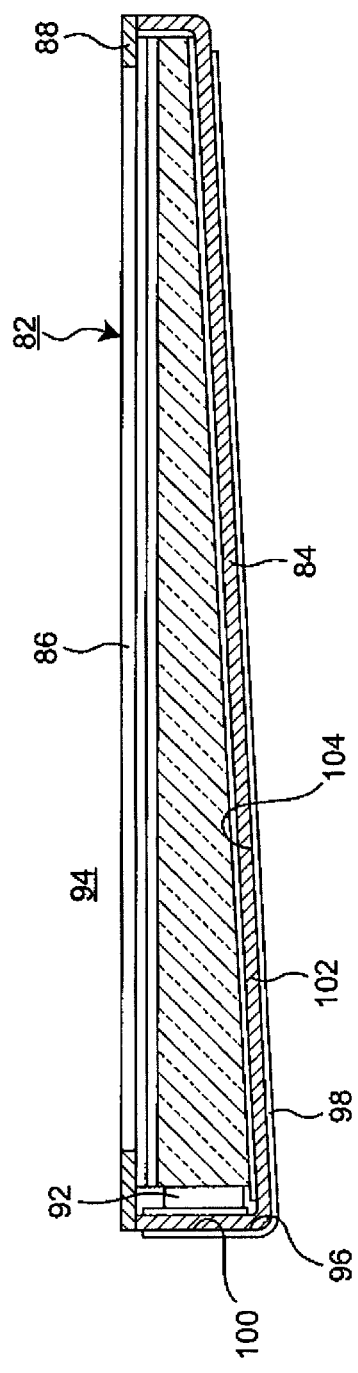
FIG. 5 is a sectional view of a backlight device according to a third embodiment of the invention.

FIG. 5 illustrates a backlight device 82 according to a third embodiment of the invention. The backlight device 82 includes a chassis 84 and a frame 88 having a large opening (outgoing face) 86. A light guide part 90 (not illustrated) and an illuminating LED light source (heating part) 92 are accommodated in a space formed between the chassis 84 and the frame 88. The light emitted from LED light source 92 is radiated upward through the light guide part 90 and the outgoing face 86. For example, preferably the chassis 84 and the frame 88 are made of a material such as aluminum having an excellent thermal conductivity.

One of features of the configuration of the third embodiment is that a radiation film 98 is bonded to an outer face 96 of the chassis 84 in order to efficiently release the heat generated in an LED light source 92 that is of the heating component to a peripheral atmosphere 94. Specifically, in the third embodiment, an outer face 100 of the housing sidewall 98 to which the LED light source 92 is attached and an outer face 104 of a housing bottom wall 102 connected to the housing sidewall 98 are covered wholly or partially with the radiation film 98.

In the backlight device 82 having the above-described configuration, the heat generated in the LED light source 92 is transferred from the housing sidewall 98 to the housing bottom wall 102, and the heat is released to the peripheral atmosphere 94 through the radiation films 98 provided in the outer faces 100 and 104. As a result, a junction temperature at the LED light source 92 is efficiently lowered, and therefore a large amount of current can be supplied to the LED light source 92 to increase a light emission amount.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. An apparatus comprising:
a chassis having a chassis inner face and a chassis outer face;
at least one heating part accommodated in the chassis, wherein at least a portion of the heating part faces the chassis inner face with an internal space therebetween; and
a film having a first face and a second face bonded to at least the portion of the heating part facing the chassis inner face, wherein
the chassis outer face is located on a side opposite the chassis inner face portion and in contact with an external space and having a radiation film interposed therebetween,
the film includes a convex part, a concave part, or a repeated pattern of convex and concave parts in the first face or the second face, and
at least one of the first face and the second face is in contact with the internal space.

2. The apparatus according to claim 1, wherein the film is a prism sheet that collects light emitted from a light source into a direction perpendicular to a display screen in a liquid crystal display device.

3. The apparatus according to claim 1, wherein the film and the adhesive material satisfy a relationship of Formula 1:

$$1/(h \cdot Ab) > dg/(\lambda g \cdot Ab) + dp/(\lambda p \cdot Ab) + 1/(h \cdot Ap), \text{ wherein} \quad \text{[Formula 1]}$$

h: heat transfer coefficient [W/(m$^2$·K)],
Ab: radiation face area of the heating part [m$^2$],
Ap: contact area of film with the internal space [m$^2$],
dg: adhesive material thickness [m],
$\lambda$g: adhesive material thermal conductivity [W/(m·K)],
dp: film thickness [m], and
$\lambda$p: film thermal conductivity [W/(m·K)].

* * * * *